(12) United States Patent
Abe

(10) Patent No.: US 11,522,157 B2
(45) Date of Patent: Dec. 6, 2022

(54) DISPLAY DEVICE COMPRISING SEALING FILM PROVIDED COVERING LIGHT-EMITTING ELEMENT

(71) Applicant: SHARP KABUSHIKI KAISHA, Sakai (JP)

(72) Inventor: Kaoru Abe, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 193 days.

(21) Appl. No.: 16/977,062

(22) PCT Filed: Mar. 9, 2018

(86) PCT No.: PCT/JP2018/009250
§ 371 (c)(1),
(2) Date: Aug. 31, 2020

(87) PCT Pub. No.: WO2019/171584
PCT Pub. Date: Sep. 12, 2019

(65) Prior Publication Data
US 2020/0403178 A1   Dec. 24, 2020

(51) Int. Cl.
*H01L 51/52* (2006.01)
*H01L 27/32* (2006.01)
*H01L 51/56* (2006.01)

(52) U.S. Cl.
CPC ...... *H01L 51/5246* (2013.01); *H01L 27/3276* (2013.01); *H01L 51/5253* (2013.01); *H01L 51/56* (2013.01); *H01L 2227/323* (2013.01)

(58) Field of Classification Search
CPC . H01L 51/5246; H01L 51/5253; H01L 51/56; H01L 2227/323
USPC ........................................................ 257/710
See application file for complete search history.

(56) References Cited

U.S. PATENT DOCUMENTS

| | | | |
|---|---|---|---|
| 2014/0367661 A1 | 12/2014 | Akagawa et al. | |
| 2017/0250380 A1 | 8/2017 | Kato | |
| 2018/0047941 A1* | 2/2018 | Kato | ........... H01L 27/3265 |

FOREIGN PATENT DOCUMENTS

| | | | |
|---|---|---|---|
| JP | 2004-039448 A | 2/2004 |
| JP | 2014-241241 A | 12/2014 |
| JP | 2017-151313 A | 8/2017 |

* cited by examiner

*Primary Examiner* — Hoai V Pham
(74) *Attorney, Agent, or Firm* — ScienBiziP, P.C.

(57) ABSTRACT

Provided is a display device including: a base substrate; a light-emitting element provided on one surface side of the base substrate; and a sealing film provided covering the light-emitting element, wherein the sealing film includes a first inorganic film and a second inorganic film sequentially provided covering the light-emitting element, and a resin layer provided in an island shape between the first inorganic film and the second inorganic film.

15 Claims, 8 Drawing Sheets

DISPLAY DEVICE COMPRISING SEALING FILM PROVIDED COVERING LIGHT-EMITTING ELEMENT

TECHNICAL FIELD

The disclosure relates to a display device and a method of manufacturing the same.

BACKGROUND ART

In recent years, organic EL display devices, which use organic electroluminescence (EL) elements and are of the self-luminous type, have attracted attention as a display device that can replace the liquid crystal display device. For the organic EL display device, a seal structure is proposed to inhibit degradation of the organic EL element due to penetration of, for example, moisture and oxygen. The seal structure includes a sealing film covering the organic EL element, and the sealing film is configured by a layered film in which an inorganic film and an organic film are layered.

For example, PTL 1 discloses an organic EL panel including a sealing film in which a first inorganic film formed by a plasma chemical vapor deposition (CVD) method, a flattening film (resin layer) formed by a sol-gel method by using an ink-jet method or the like, and a second inorganic film formed by a plasma CVD method are layered in order.

CITATION LIST

Patent Literature

PTL 1: JP 2014-241241 A

SUMMARY

Technical Problem

In an organic EL display device including a sealing film obtained by sequentially laminating a first inorganic film, a flattening film, and a second inorganic film such as the organic EL panel disclosed in PTL 1 described above, since the flattening film (resin layer) is provided relatively thick over the entire display region in which the organic EL element is provided, the overall film thickness of the sealing film is 5 μm or greater, and thus the flexibility of the device itself is reduced.

The disclosure has been made in view of the above, and an object of the disclosure is to improve flexibility of a device itself.

Solution to Problem

In order to achieve the object described above, a display device according to the disclosure is a display device including: a base substrate; a light-emitting element provided on one surface side of the base substrate; and a sealing film provided covering the light-emitting element, wherein the sealing film includes a first inorganic film and a second inorganic film sequentially provided covering the light-emitting element, and a resin layer provided in an island shape between the first inorganic film and the second inorganic film.

Advantageous Effects of Disclosure

According to the disclosure, the sealing film includes the first inorganic film and the second inorganic film sequentially provided covering the light-emitting element and the resin layer provided in an island shape between the first inorganic film and the second inorganic film, and thus the flexibility of the device itself can be improved.

DESCRIPTION OF EMBODIMENTS

Embodiments of the disclosure will be described below in detail with reference to the drawings. Note that the disclosure is not limited to the embodiments described below.

First Embodiment

Figure 1:
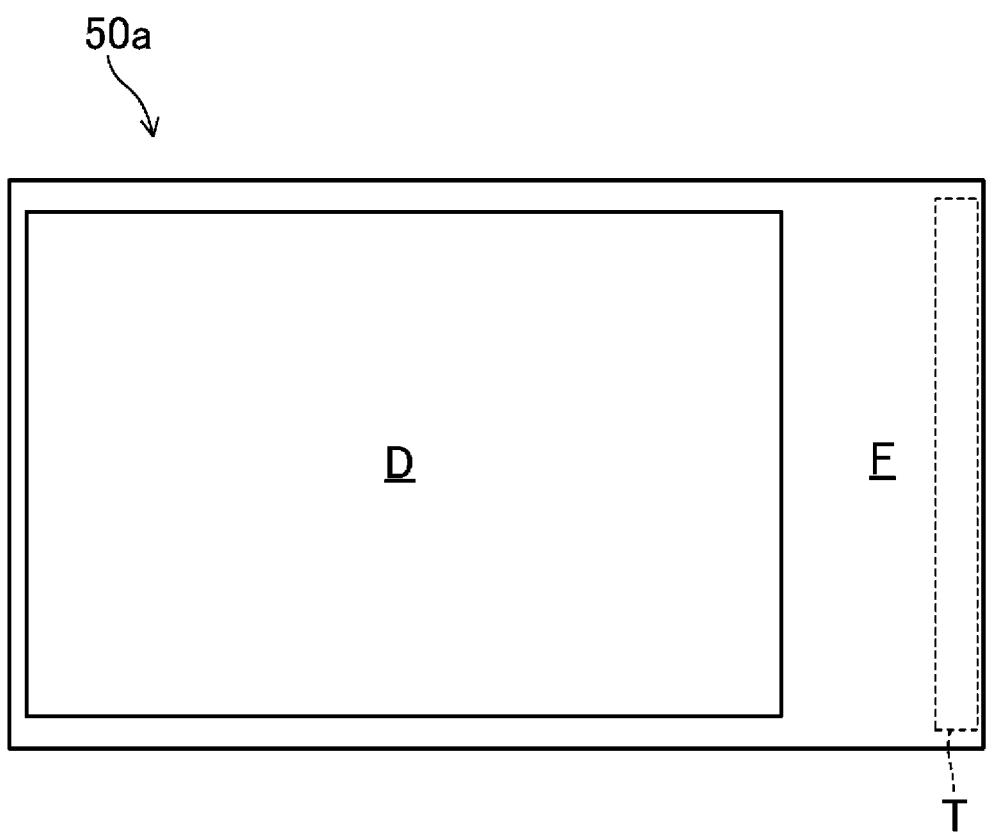
FIG. 1 is a plan view of an organic EL display device according to a first embodiment of the disclosure.
Figure 2:
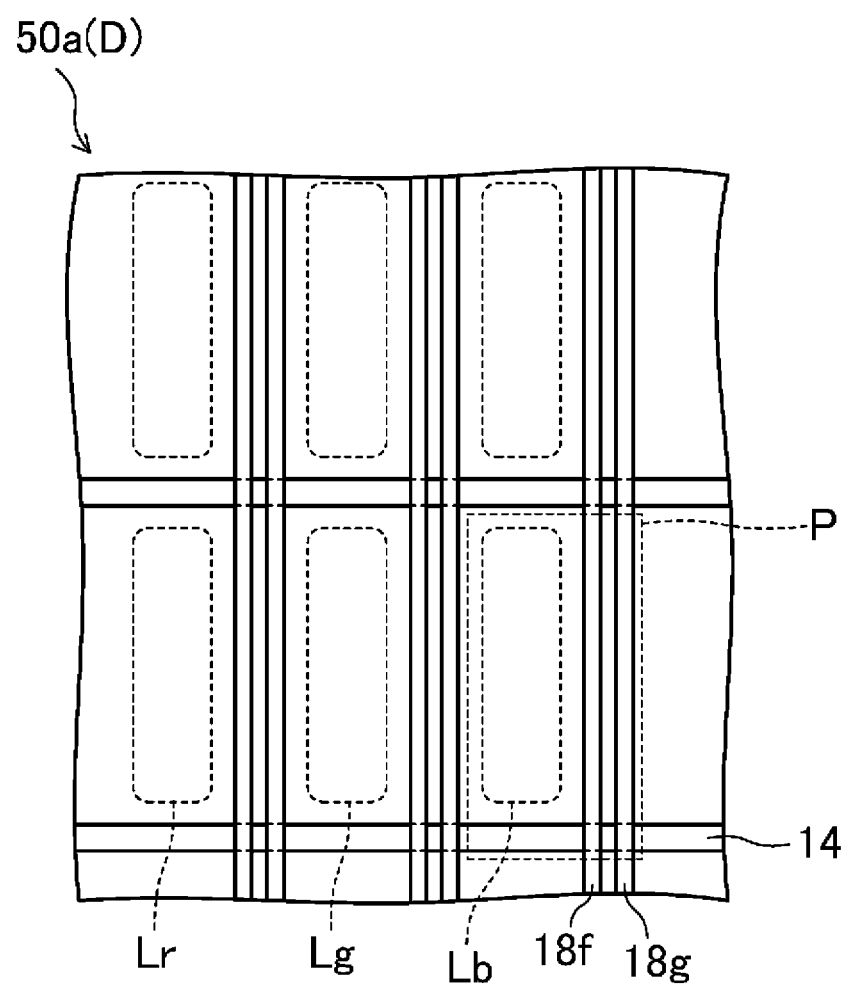
FIG. 2 is a plan view of a display region of the organic EL display device according to the first embodiment of the disclosure.
Figure 3:
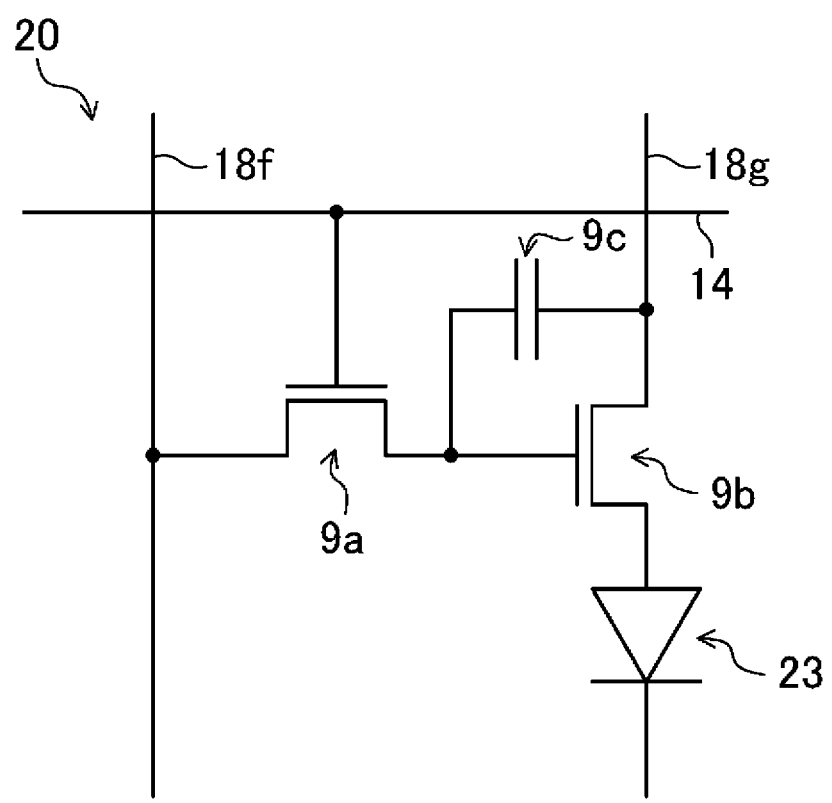
FIG. 3 is an equivalent circuit diagram of a TFT layer included in the organic EL display device according to the first embodiment of the disclosure.
Figure 4:
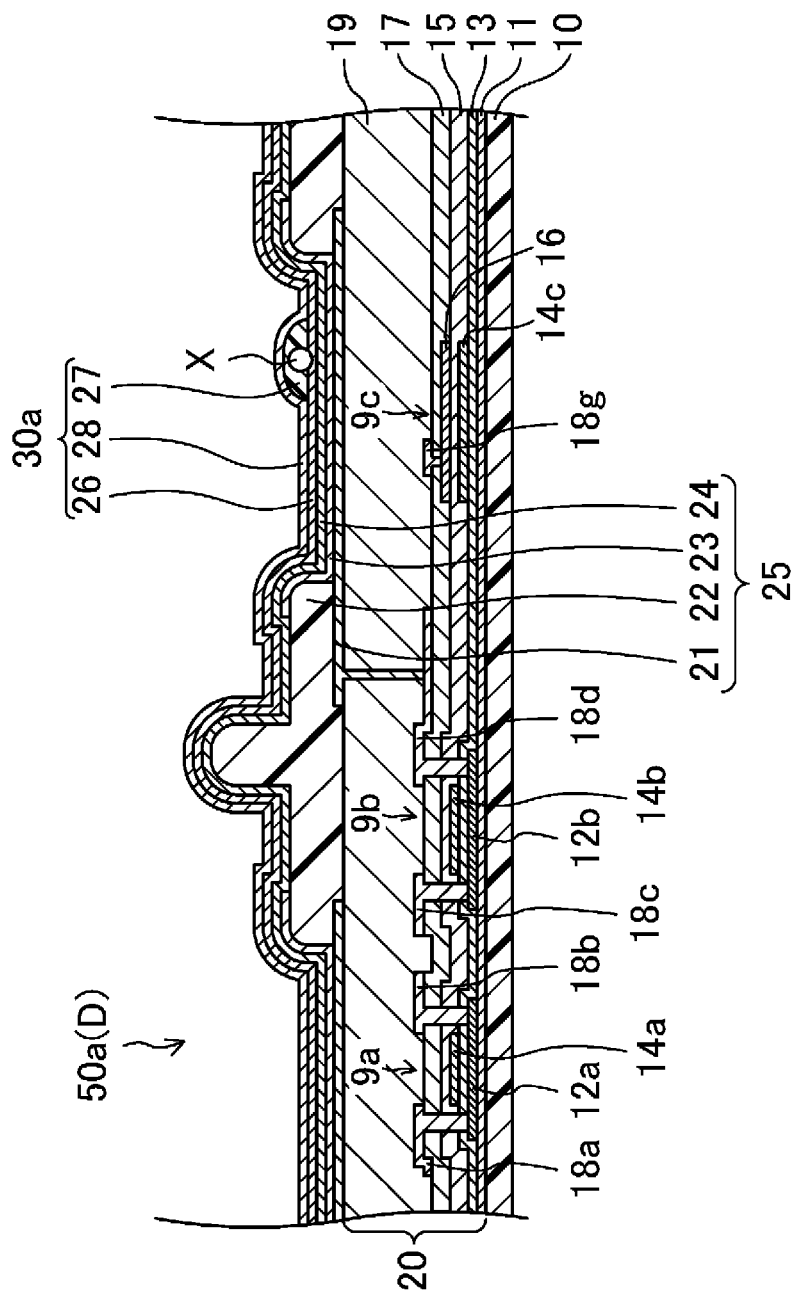
FIG. 4 is a cross-sectional view of the display region of the organic EL display device according to the first embodiment of the disclosure.
Figure 5:
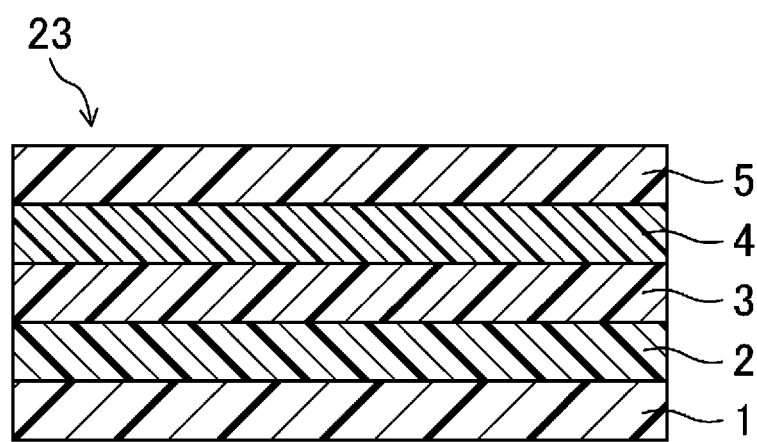
FIG. 5 is a cross-sectional view illustrating an organic EL layer included in the organic EL display device according to the first embodiment of the disclosure.

FIG. 1 to FIG. 6 illustrate a first embodiment of a display device and a method of manufacturing the same according to the disclosure. Note that, in each of the following embodiments, an organic EL display device including an organic EL element will be described as a display device including a light-emitting element. Here, FIG. 1 is a plan view of an organic EL display device 50a of the present embodiment. FIG. 2 is a plan view of a display region D of the organic EL display device 50a. FIG. 3 is an equivalent circuit diagram of a TFT layer 20 constituting the organic EL display device 50a. FIG. 4 is a cross-sectional view of the display region D of the organic EL display device 50a. FIG. 5 is a cross-sectional view illustrating an organic EL layer 23 constituting the organic EL display device 50a.

As illustrated in FIG. 1, the organic EL display device 50a includes the display region D configured to display an image provided in a rectangular shape and a frame region F provided on the periphery of the display region D. Here, a plurality of subpixels P are disposed in a matrix configuration in the display region D, as illustrated in FIG. 2. In the display region D, a subpixel P including a light-emitting region Lr configured to execute a red display, a subpixel P including a light-emitting region Lg configured to execute a green display, and a subpixel P including a light-emitting region Lb configured to execute a blue display are provided adjacent to one another, as illustrated in FIG. 2. Note that one pixel is constituted of the three adjacent subpixels P including the light-emitting regions Lr, Lg, and Lb, respectively in the display region D. A terminal region T is provided at the right end portion of the frame region F in FIG. 1.

As illustrated in FIG. 4, the organic EL display device 50a includes a resin substrate layer 10 provided as a base substrate, a thin film transistor (TFT) layer 20 provided on the resin substrate layer 10, an organic EL element 25 provided as a light-emitting element on the TFT layer 20, and a sealing film 30a provided in such a manner as to cover the organic EL element 25.

The resin substrate layer 10 is formed, for example, of a polyimide resin or the like.

As illustrated in FIG. 4, the TFT layer 20 includes a base coat film 11 provided on the resin substrate layer 10, a plurality of first TFTs 9a, a plurality of second TFTs 9b and a plurality of capacitors 9c provided on the base coat film 11, and a flattening film 19 provided on each of the first TFTs 9a, each of the second TFTs 9b and each of the capacitors 9c. Here, in the TFT layer 20, as illustrated in FIG. 2 and FIG. 3, a plurality of gate lines 14 are provided in such a manner as to extend parallel to each other in a horizontal direction in the figures. In the TFT layer 20, as illustrated in FIG. 2 and FIG. 3, a plurality of source lines 18f are provided in such a manner as to extend parallel to each other in a vertical direction in the figures. In the TFT layer 20, as illustrated in FIG. 2 and FIG. 3, a plurality of power source lines 18g are provided in such a manner as to extend parallel to each other in the vertical direction in the figures, and each of power source lines 18g are disposed adjacent to each of the source lines 18f. In the TFT layer 20, as illustrated in FIG. 3, each subpixel P includes the first TFT 9a, the second TFT 9b, and the capacitor 9c.

The base coat film 11 is made up of a single-layer film or a layered film of an inorganic insulating film of, for example, silicon nitride, silicon oxide, silicon oxynitride, or the like.

The first TFT 9a is connected to the corresponding gate line 14 and source line 18f in each subpixel P as illustrated in FIG. 3. As illustrated in FIG. 4, the first TFT 9a includes a semiconductor layer 12a, a gate insulating film 13, a gate electrode 14a, a first interlayer insulating film 15, a second interlayer insulating film 17, and a source electrode 18a and a drain electrode 18b, provided in that order on the base coat film 11. Here, as illustrated in FIG. 4, the semiconductor layer 12a includes a channel region, a source region, and a drain region, provided in an island shape on the base coat film 11, as described below. As illustrated in FIG. 4, the gate insulating film 13 is provided in such a manner as to cover the semiconductor layer 12a. As illustrated in FIG. 4, the gate electrode 14a is provided on the gate insulating film 13 in such a manner as to overlap with the channel region of the semiconductor layer 12a. As illustrated in FIG. 4, the first interlayer insulating film 15 and the second interlayer insulating film 17 are sequentially provided in such a manner as to cover the gate electrode 14a. As illustrated in FIG. 4, the source electrode 18a and the drain electrode 18b are provided in such a manner as to be separated from each other on the second interlayer insulating film 17. As illustrated in FIG. 4, the source electrode 18a and the drain electrode 18b are connected to the source region and the drain region of the semiconductor layer 12a, respectively, via each contact hole formed in the layered film of the gate insulating film 13, the first interlayer insulating film 15, and the second interlayer insulating film 17. Note that, the gate insulating film 13, the first interlayer insulating film 15 and the second interlayer insulating film 17 are made up of a single-layer film or a layered film of an inorganic insulating film of, for example, silicon nitride, silicon oxide, silicon oxynitride, or the like.

The second TFT 9b is connected to the corresponding first TFT 9a and power source line 18g in each subpixel P as illustrated in FIG. 3. As illustrated in FIG. 4, the second TFT 9b includes a semiconductor layer 12b, a gate insulating film 13, a gate electrode 14b, a first interlayer insulating film 15, a second interlayer insulating film 17, and a source electrode 18c and a drain electrode 18d, provided in that order on the base coat film 11. Here, as illustrated in FIG. 4, the semiconductor layer 12b includes a channel region, a source region, and a drain region, provided in an island shape on the base coat film 11, as described below. As illustrated in FIG. 4, the gate insulating film 13 is provided in such a manner as to cover the semiconductor layer 12b. As illustrated in FIG. 4, the gate electrode 14b is provided on the gate insulating film 13 in such a manner as to overlap with the channel region of the semiconductor layer 12b. As illustrated in FIG. 4, the first interlayer insulating film 15 and the second interlayer insulating film 17 are sequentially provided in such a manner as to cover the gate electrode 14b. As illustrated in FIG. 4, the source electrode 18c and the drain electrode 18d are provided in such a manner as to be separated from each other on the second interlayer insulating film 17. As illustrated in FIG. 4, the source electrode 18c and the drain electrode 18d are connected to the source region and the drain region of the semiconductor layer 12b, respectively, via each contact hole formed in the layered film of the gate insulating film 13, the first interlayer insulating film 15, and the second interlayer insulating film 17.

Note that, in this embodiment, the first TFT 9a and the second TFT 9b are described as being of a top-gate type; however, the first TFT 9a and the second TFT 9b may be a bottom-gate type TFT.

The capacitor 9c is connected to the corresponding first TFT 9a and power source line 18g in each subpixel P as illustrated in FIG. 3. Here, the capacitor 9c includes, as illustrated in FIG. 4, a lower conductive layer 14c formed of the same material and in the same layer as those of the gate electrode 14a or the like, the first interlayer insulating film 15 provided in such a manner as to cover the lower conductive layer 14c, and an upper conductive layer 16 provided on the first interlayer insulating film 15 in such a manner as to overlap the lower conductive layer 14c. Note that, the upper conductive layer 16 is connected to the power source line 18g through a contact hole formed in the second interlayer insulating film 17 as illustrated in FIG. 4.

The flattening film 19 is formed of, for example, an organic resin material, such as a polyimide resin.

The organic EL element 25 includes, as illustrated in FIG. 4, a plurality of first electrodes 21, an edge cover 22, a plurality of organic EL layers 23, and a second electrode 24 that are provided sequentially on the flattening film 19.

As illustrated in FIG. 4, the plurality of first electrodes 21 are provided, each corresponding to each of the plurality of subpixels P, in a matrix pattern over the flattening film 19. As illustrated in FIG. 4, the first electrode 21 is connected to the drain electrode 18d of each second TFT 9b via a contact hole formed in the flattening film 19. The first electrode 21 functions to inject holes (positive holes) into the organic EL layer 23. The first electrode 21 is preferably formed of a material having a large work function to improve the hole injection efficiency into the organic EL layer 23. Here, examples of the materials constituting the first electrode 21 include metallic materials, as examples, such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). The materials constituting the first electrode 21 may be an alloy such as astatine (At)/astatine oxide ($AtO_2$), for example. For the materials constituting the first electrode 21, there may be adopted electrically conductive oxides, as examples, such as tin oxide (SnO), zinc oxide (ZnO), indium tin oxide (ITO), and indium zinc oxide (IZO). The first electrode 21 may be formed by layering a plurality of layers formed of any of the materials described above. Note that, examples of compound materials having a large work function include, for example, indium tin oxide (ITO) and indium zinc oxide (IZO).

As illustrated in FIG. 4, the edge cover 22 is provided in the form of a lattice in such a manner as to cover a circumferential edge portion of each first electrode 21. For the materials making up the edge cover 22, there are raised organic films of, for example, polyimide resin, acrylic resin, polysiloxane resin, and novolak resin.

As illustrated in FIG. 4, the plurality of organic EL layers 23 are disposed on each of the first electrodes 21 and are each provided in a matrix shape so as to correspond to the plurality of subpixels. As illustrated in FIG. 5, each organic EL layer 23 includes a hole injection layer 1, a hole transport layer 2, a light-emitting layer 3, an electron transport layer 4, and an electron injection layer 5, which are provided sequentially in that order over the first electrode 21.

The hole injection layer 1 is also referred to as an anode electrode buffer layer, and functions to reduce an energy level difference between the first electrode 21 and the organic EL layer 23 to thereby improve the hole injection efficiency into the organic EL layer 23 from the first electrode 21. Examples of materials that may be included in the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 functions to improve the efficiency of hole transport from the first electrode 21 to the organic EL layer 23. Here, examples of materials that may be included in the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where holes and electrons are injected from the first electrode 21 and the second electrode 24, respectively, and the holes and the electrons recombine, when a voltage is applied via the first electrode 21 and the second electrode 24. The light-emitting layer 3 is formed of a material having high luminous efficiency. Examples of materials that may be included in the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 functions to facilitate migration of electrons to the light-emitting layer 3 efficiently. Examples of materials constituting the electron transport layer 4 include oxadiazole derivative, triazole derivative, benzoquinone derivative, naphthoquinone derivative, anthraquinone derivative, tetracyanoanthraquinodimethane derivative, diphenoquinone derivative, fluorenone derivative, silole derivative, and metal oxinoid compound, as organic compounds.

The electron injection layer 5 functions to reduce an energy level difference between the second electrode 24 and the organic EL layer 23 to thereby improve the efficiency of electron injection into the organic EL layer 23 from the second electrode 24, and the electron injection layer 5 can lower the drive voltage of the organic EL element 25 by this function. Note that the electron injection layer 5 is also referred to as a cathode buffer layer. Here, examples of materials that may constitute the electron injection layer 5 include inorganic alkaline compounds, such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), and strontium oxide (SrO).

As illustrated in FIG. 4, the second electrode 24 is provided to cover each organic EL layer 23 and edge cover 22 as a common electrode. The second electrode 24 functions to inject electrons into the organic EL layer 23. The second electrode 24 is preferably formed of a material having a small work function to improve the efficiency of electron injection into the organic EL layer 23. For materials constituting the second electrode 24 include, for example, silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 24 may be formed of alloys of magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al), for example. The second electrode 24 may be formed of an electrically conductive oxide such as tin oxide (SnO), zinc oxide (ZnO), indium tin oxide (ITO), and indium zinc oxide (IZO). The second electrode 24 may be formed by layering a plurality of layers of any of the materials described above. Note that, examples of materials having a small work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al).

As illustrated in FIG. 4, the sealing film 30a includes a first inorganic film 26 and a second inorganic film 28, which are sequentially provided in such a manner as to cover (the second electrode 24 of) the organic EL element 25, and a plurality of resin layers 27 provided in an island shape in such a manner as to be spaced apart from each other between the first inorganic film 26 and the second inorganic film 28, and functions to protect the organic EL layer 23 from moisture and oxygen.

The first inorganic film 26 and the second inorganic film 28 are formed, for example, to have a thickness less than 1 μm, from inorganic materials such as a silicon nitride film. Here, the refractive indices of the first inorganic film 26 and the second inorganic film 28 are, for example, approximately 1.76 to 1.86. Note that in the present embodiment, as illustrated in FIG. 4, a configuration in which a foreign matter X adheres to the surface of the first inorganic film 26 on the second inorganic film 28 side is exemplified. However, the foreign matter X may be attached to the surface of the second electrode 24 of the organic EL element 25 or to both the surface of the second electrode 24 of the organic EL element 25 and the surface of the first inorganic film 26 on the second inorganic film 28 side.

The resin layer 27 includes, for example, an organic resin material such as a polypropylene resin and an additive added to the organic resin material. As illustrated in FIG. 4, the resin layer 27 is provided in such a manner as to cover the foreign matter X. Here, the refractive index of the resin layer 27 is, for example, approximately 1.79, and the refractive index difference between the first inorganic film 26 and the second inorganic film 28 is less than 0.1. Examples of the additive include silane coupling agents. Specifically, the resin layer 27 of a polypropylene resin containing, for example, a silane coupling agent as an additive at 0.1 wt. % to 20 wt. %, has a refractive index of 1.79.

In the organic EL display device 50*a* described heretofore, in each subpixel P, a gate signal is inputted into the first TFT 9*a* via the gate line 14 to thereby turn on the first TFT 9*a*, a predetermined voltage corresponding to a source signal is written in the gate electrode 14*b* of the second TFT 9*b* and the capacitor 9*c* via the source line 18*f*, and the current from the power source line 18*g* specified based on a gate voltage of the second TFT 9*b* is supplied to the organic EL layer 23, whereby the light-emitting layer 3 of the organic EL layer 23 emits light to display an image. Note that, in the organic EL display device 50*a*, since even in a case where the first TFT 9*a* is turned off, the gate voltage of the second TFT 9*b* is held by the capacitor 9*c*, so the light-emitting layer 3 is kept emitting light until a gate signal of the next frame is inputted.

Figure 6:
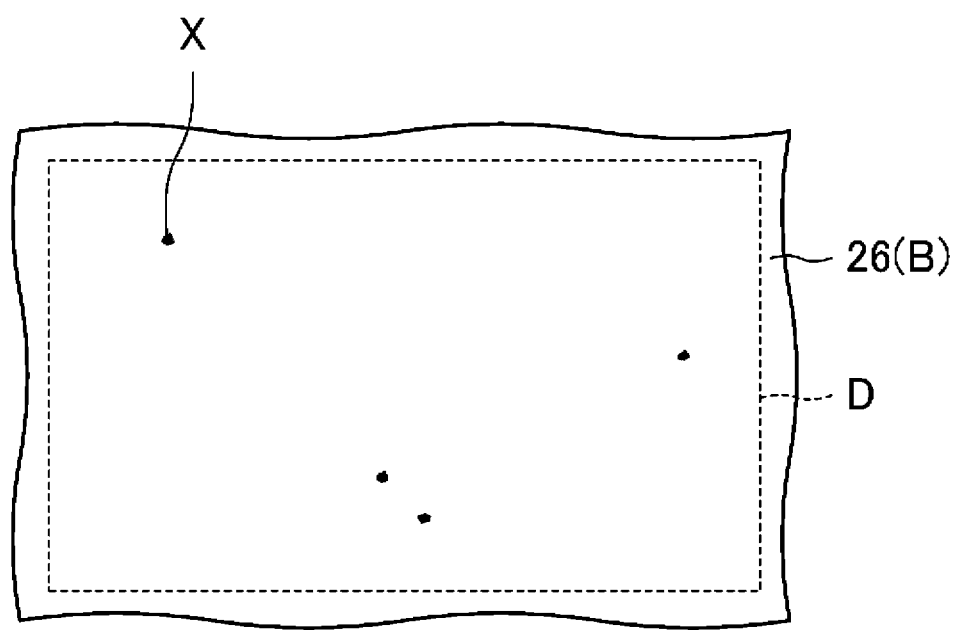
FIG. 6 is a plan view illustrating a substrate in a foreign matter detection step of a method of manufacturing the organic EL display device according to the first embodiment of the disclosure.

A method of manufacturing the organic EL display device 50*a* according to the present embodiment will be described next. Here, FIG. 6 is a plan view illustrating a substrate B in a foreign matter detection step of the method of manufacturing the organic EL display device 50*a*. Note that the method of manufacturing the organic EL display device 50*a* according to the present embodiment includes a TFT layer formation step, an organic EL element formation step, a sealing film formation step including a first inorganic film formation step, a foreign matter detection step, a position storage step, a resin layer formation step and a second inorganic film formation step, and a flexing step.

TFT Layer Formation Step

For example, the TFT layer 20 is formed on the surface of the resin substrate layer 10 formed on the glass substrate by forming the base coat film 11, the first TFT 9*a*, the second TFT 9*b*, the capacitor 9*c*, and the flattening film 19 by using a known method.

Organic EL Element Formation Step

The organic EL element 25 is formed on the TFT layer 20 formed in the TFT layer formation step described above by forming the first electrode 21, the edge cover 22, the organic EL layer 23 (the hole injection layer 1, the hole transport layer 2, the light-emitting layer 3, the electron transport layer 4, and the electron injection layer 5) and the second electrode 24 by using a known method.

Sealing Film Formation Step

At first, the first inorganic film 26 is formed, for example, by forming an inorganic insulating film such as a silicon nitride film at the thickness of approximately 500 nm through plasma CVD or the like, in such a manner as to cover the organic EL element 25 formed by the organic EL element formation step described above (first inorganic film formation step).

Subsequently, the surface of the substrate B on which the first inorganic film 26 is formed is inspected by using an Automated Optical Inspection (AOI) device including a charge coupled device (CCD) camera. As illustrated in FIG. 6, the locations of foreign matters X adhering to the surface of the first inorganic film 26 are detected (foreign matter detection step). At this time, the positions (foreign matter position information) of the foreign matters X is stored in a memory electrically connected to the automated optical inspection device and an inkjet coating device (position storage step).

Furthermore, the resin layer 27 having a thickness of 1 μm is formed, for example, by ejecting an organic resin material such as a polypropylene resin containing an additive, for example, by an ink-jet method, at the positions of the foreign matters X stored in the position storage step described above (resin layer formation step).

Finally, by forming an inorganic insulating film such as a silicon nitride film at a thickness of approximately 500 nm, for example, through plasma CVD or the like in such a manner as to cover the resin layer 27 formed in the resin layer formation step described above, the second inorganic film 28 is formed and the sealing film 30*a* is formed (second inorganic film formation step).

Flexing Step

After a surface side protective sheet (not illustrated) is applied to the surface of the sealing film 30*a* formed in the sealing film formation step described above, the glass substrate is peeled from the lower face of the resin substrate layer 10 by irradiating with laser light from the glass substrate side of the resin substrate layer 10, and a back face side protective sheet (not illustrated) is further applied to the lower face of the resin substrate layer 10 where the glass substrate is peeled.

The organic EL display device 50*a* of the present embodiment can be manufactured in this manner.

As described above, according to the organic EL display device 50*a* and the method of manufacturing the same of the present embodiment, since the sealing film 30*a* includes the first inorganic film 26 and the second inorganic film 28 that are sequentially provided so that the sealing film 30*a* covers the organic EL element 25, and the resin layer 27 provided in an island shape between the first inorganic film 26 and the second inorganic film 28, the overall thickness of the sealing film 30*a* can be made thinner than a case that the resin layer 27 is provided throughout the display region D between the first inorganic film 26 and the second inorganic film 28. As a result, in the organic EL display device 50*a*, the flexibility of the sealing film 30*a* that occupies a relatively large proportion of the device thickness can be improved, so the flexibility of the device itself can be improved in the organic EL display device 50*a*.

According to the organic EL display device 50*a* and the method of manufacturing the same of the present embodiment, since the refractive index difference between the resin layer 27 and the first inorganic film 26 and the second inorganic film 28 is less than 0.1, the resin layer 27 is hardly visible in the display region D, and the display quality of the organic EL display device 50a can be ensured.

According to the organic EL display device 50a and the method of manufacturing the same of the present embodiment, since the resin layer 27 is provided in such a manner as to cover the foreign matters X, the foreign matters X are difficult to break through the second inorganic film 28, and sealing performance by the sealing film 30a can be ensured. As a result, the deterioration of the organic EL element 25 can be suppressed in the organic EL display device 50a.

Second Embodiment

Figure 7:
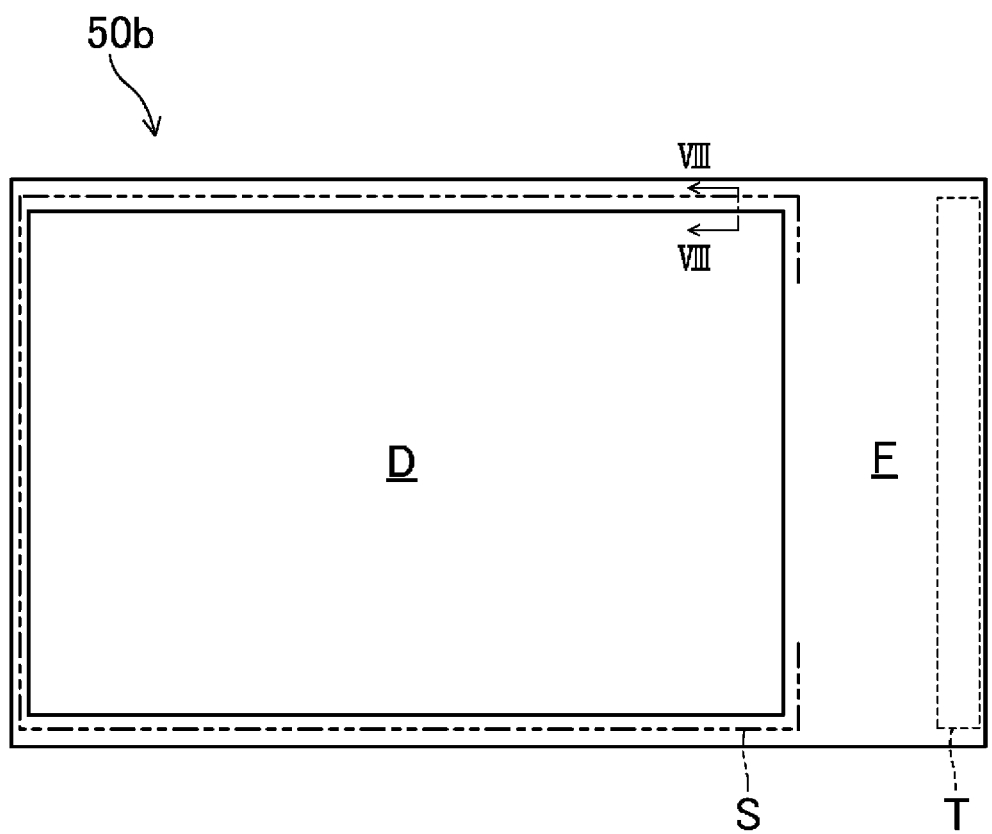
FIG. 7 is a plan view of an organic EL display device according to a second embodiment of the disclosure.
Figure 8:
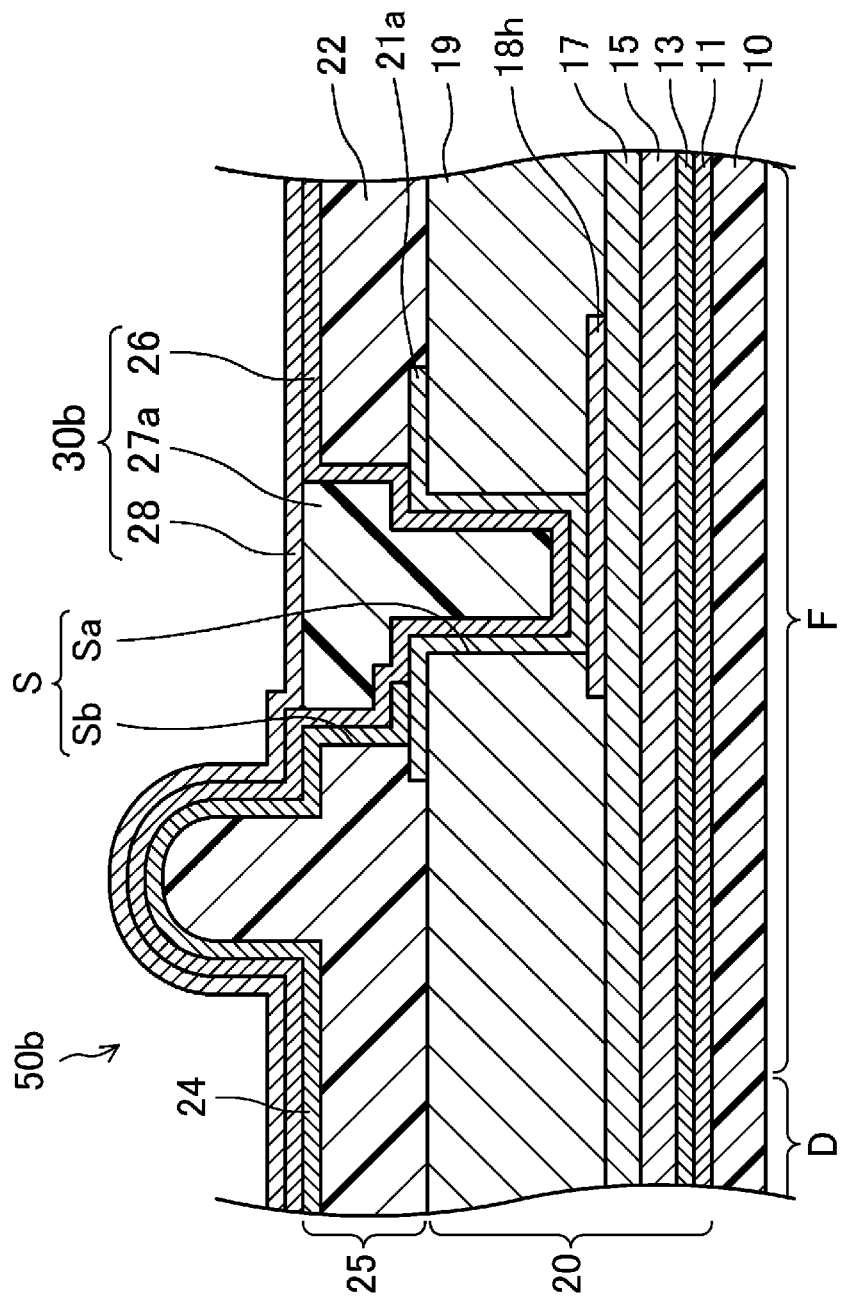
FIG. 8 is a cross-sectional view of the organic EL display device taken along the line VIII-VIII in FIG. 7.

FIG. 7 and FIG. 8 illustrate a second embodiment of a display device and a method of manufacturing the same according to the disclosure. Here, FIG. 7 is a plan view of an organic EL display device 50b of the present embodiment. FIG. 8 is a cross-sectional view of the organic EL display device 50b taken along the line VIII-VIII in FIG. 7. Note that, in the following embodiments, portions identical to those in FIG. 1 to FIG. 6 are denoted by the same reference signs, and their detailed descriptions are omitted.

In the first embodiment described above, an organic EL display device 50a provided with a resin layer 27 formed by an ink-jet method is exemplified, but in the present embodiment, an organic EL display device 50b provided with resin layers 27 and 27a formed by an ink-jet method is exemplified.

As illustrated in FIG. 7, like the organic EL display device 50a described in the first embodiment described above, the organic EL display device 50b includes a display region D provided into a rectangle shape and a frame region F provided around the display region D, and a terminal region T is provided at the right end portion of the frame region F in FIG. 7.

As illustrated in FIG. 8, the organic EL display device 50b includes a resin substrate layer 10, a TFT layer 20 provided on the resin substrate layer 10, an organic EL element 25 provided as a light-emitting element on the TFT layer 20, and a sealing film 30b provided in such a manner as to cover the organic EL element 25.

As illustrated in FIG. 8, the flattening film 19 constituting the TFT layer 20 includes a slit Sa that penetrates the flattening film 19 in such a manner as to surround the display region D, in the frame region F.

As illustrated in FIG. 8, the edge cover 22 constituting the organic EL element 25 includes a slit Sb that penetrates the edge cover 22 in such a manner as to surround the display region D, in the frame region F. Here, as illustrated in FIG. 8, the slit Sb is provided in such a manner as to overlap the slit Sa, and constitutes the slit S together with the slit Sa. Note that the slit S is provided in approximately a U shape in such a manner as to surround the display region D, as illustrated in FIG. 7.

As illustrated in FIG. 8, in the frame region F, a source conductive layer 18h formed from the same material to the same layer as the source electrode 18a or the like is provided as a wiring line layer, and an anode electrode conductive layer 21a formed by the same material to the same layer as the first electrode 21 is provided as a wiring line relay layer. Here, the source conductive layer 18h is provided in a substantially frame shape in a plan view, and as illustrated in FIG. 8, a part of the source conductive layer 18h is exposed from the slit Sa formed in the flattening film 19. As illustrated in FIG. 8, the anode electrode conductive layer 21a is provided in such a manner as to cover both end surfaces and edges of the slit Sa formed in the flattening film 19 and the source conductive layer 18h exposed from the slit Sa, and is electrically connected to the source conductive layer 18h.

As illustrated in FIG. 8, the second electrode 24 constituting the organic EL element 25 is provided in such a manner as to cover the end surface of the display region D side of the slit Sb formed in the edge cover 22 and a portion of the upper surface of the anode electrode conductive layer 21a exposed from the slit Sb, and is electrically connected to the anode electrode conductive layer 21a. In other words, as illustrated in FIG. 8, the second electrode 24 is electrically connected to the source conductive layer 18h via the slits S (slits Sa and Sb).

As illustrated in FIG. 8, the sealing film 30b includes a first inorganic film 26 and a second inorganic film 28 that are sequentially provided in such a manner as to cover the organic EL element 25, a plurality of resin layers 27 (see FIG. 4) provided between the first inorganic film 26 and the second inorganic film 28 in the display region D, and a resin layer 27a provided in a frame shape between the first inorganic film 26 and the second inorganic film 28 in the frame region F. Similar to the sealing film 30a described in the first embodiment described above, the sealing film 30b has a function of protecting the organic EL layer 23 from moisture and oxygen.

The resin layer 27a is formed from the same material to the same layer as the resin layer 27, and is provided in such a manner as to be filled to the inside of the slit S via the first inorganic film 26, as illustrated in FIG. 8. Here, as illustrated in FIG. 8, the second inorganic film 28 is provided in such a manner as to cover the resin layer 27a in the frame region F. Note that in the present embodiment, an organic EL display device 50b having a configuration in which the resin layer 27a is filled to the inside of the slit S is exemplified, but in the organic EL display device 50a of the first embodiment described above, the first inorganic film 26 and the second inorganic film 28 are layered inside the slit S without the resin layer 27a being filled into the slit S.

Similar to the organic EL display device 50a described in the first embodiment described above, the organic EL display device 50b described above is flexible and displays an image by causing a light-emitting layer 3 of the organic EL layer 23 to emit light as required via the first TFT 9a and the second TFT 9b in each subpixel P.

The organic EL display device 50b of the present embodiment can be manufactured, by modifying the pattern shapes of the conductive films in forming the source electrode 18a, the first electrode 21 and the second electrode 24, and also forming the resin layer 27a by an ink-jet method in forming the resin layer 27, in the method for manufacturing the organic EL display device 50a of the first embodiment described above.

As described above, according to the organic EL display device 50b and the method of manufacturing the same of the present embodiment, since the sealing film 30b includes the first inorganic film 26 and the second inorganic film 28 that are sequentially provided so that the sealing film 30b covers the organic EL element 25, and the resin layer 27 provided in an island shape between the first inorganic film 26 and the second inorganic film 28, the overall thickness of the sealing film 30b can be made thinner than a case that the resin layer 27 is provided throughout the display region D between the first inorganic film 26 and the second inorganic film 28. As a result, in the organic EL display device 50b, the flexibility of the sealing film 30b that occupies a relatively large proportion of the device thickness can be improved, so the flexibility of the device itself can be improved in the organic EL display device 50b.

According to the organic EL display device 50b and the method of manufacturing the same of the present embodiment, since the refractive index difference between the resin layer 27 and the first inorganic film 26 and the second inorganic film 28 is less than 0.1, the resin layer 27 is hardly visible in the display region D, and the display quality of the organic EL display device 50b can be ensured.

According to the organic EL display device 50b and the method of manufacturing the same of the present embodiment, since the resin layer 27 is provided in such a manner as to cover the foreign matters X, the foreign matters X are difficult to break through the second inorganic film 28, and sealing performance by the sealing film 30b can be ensured. As a result, the deterioration of the organic EL element 25 can be suppressed in the organic EL display device 50b.

According to the organic EL display device 50b and the method of manufacturing the same of the present embodiment, since the resin layer 27a is filled into the slit S via the first inorganic film 26, the second inorganic film 28 can be formed without stepped (cut by step) even in a case where the slit S is formed deep.

According to the organic EL display device 50b and the method of manufacturing the same of the present embodiment, since the refractive index difference between the resin layer 27a and the first inorganic film 26 and the second inorganic film 28 is less than 0.1, variations in the appearance of the display region D from the sides away from the front can be suppressed.

Other Embodiments

In the above-described embodiments, the example of the organic EL layer including the five-layer structure including the hole injection layer, the hole transport layer, the light-emitting layer, the electron transport layer, and the electron injection layer is given. It is also possible that, for example, the organic EL layer may include a three-layer structure including a hole injection-cum-transport layer, a light-emitting layer, and an electron transport-cum-injection layer.

In each of the embodiments described above, the organic EL display device including the first electrode as an anode electrode and the second electrode as a cathode electrode is exemplified. The disclosure is also applicable to an organic EL display device, in which the layers of the structure of the organic EL layer are in the reverse order, with the first electrode being a cathode electrode and the second electrode being an anode electrode.

In each of the embodiments described above, the organic EL display device including an element substrate, in which the electrode of the TFT connected to the first electrode serves as the drain electrode, is exemplified. The disclosure is also applicable to an organic EL display device including an element substrate, in which the electrode of the TFT connected to the first electrode is referred to as the source electrode.

In the above-described embodiments, the examples of organic EL display devices described as display device are given. However, the disclosure is applicable to a display device including a plurality of light-emitting elements that are driven by electrical current. For example, the disclosure is applicable to display devices including quantum dot light-emitting diodes (QLEDs), which are light-emitting elements using a quantum dot-containing layer.

INDUSTRIAL APPLICABILITY

As described above, the disclosure is useful for a flexible display device.

The invention claimed is:

1. A display device comprising:
a base substrate;
a light-emitting element provided on one surface side of the base substrate; and
a sealing film provided covering the light-emitting element,
wherein the sealing film includes a first inorganic film and a second inorganic film sequentially provided covering the light-emitting element, and a resin layer provided in an island shape between the first inorganic film and the second inorganic film, and
a refractive index difference between the resin layer and the first inorganic film and the second inorganic film is less than 0.1,
wherein the display device further comprising:
a display region provided with the light-emitting element;
a frame region provided around the display region; and
a TFT layer provided between the base substrate and the light-emitting element,
wherein the light-emitting element includes a common electrode,
the TFT layer includes a wiring line layer and a flattening film provided on the wiring line layer,
a slit is provided in the flattening film, the slit surrounding the display region in the frame region,
the common electrode is electrically connected to the wiring line layer via the slit,
a second resin layer formed by a same material to a same layer as the resin layer is filled into the slit via the first inorganic film, and
the second inorganic film is provided covering the second resin layer.

2. The display device according to claim 1, wherein the first inorganic film and the second inorganic film are formed by a silicon nitride film.

3. The display device according to claim 1, wherein the light-emitting element is an organic EL element.

4. The display device according to claim 1, wherein the resin layer includes a polypropylene resin.

5. A display device comprising:
a base substrate;
a light-emitting element provided on one surface side of the base substrate; and
a sealing film provided covering the light-emitting element,
wherein the sealing film includes a first inorganic film and a second inorganic film sequentially provided covering the light-emitting element, and a resin layer provided in an island shape between the first inorganic film and the second inorganic film, and
a refractive index difference between the resin layer and the first inorganic film and the second inorganic film is less than 0.1,
wherein the resin layer includes a polypropylene resin
wherein the display device further comprising:
a display region provided with the light-emitting element;
a frame region provided around the display region; and a TFT layer provided between the base substrate and the light-emitting element,
wherein the light-emitting element includes a common electrode,
the TFT layer includes a wiring line layer and a flattening film provided on the wiring line layer,
a slit is provided in the flattening film, the slit surrounding the display region in the frame region,
the common electrode is electrically connected to the wiring line layer via the slit,
a second resin layer formed by a same material to a same layer as the resin layer is filled into the slit via the first inorganic film, and
the second inorganic film is provided covering the second resin layer.

6. The display device according to claim 5,
wherein the first inorganic film and the second inorganic film are formed by a silicon nitride film.

7. The display device according to claim 5,
wherein the light-emitting element is an organic EL element.

8. A method of manufacturing a display device, the method comprising the steps of:
forming a light-emitting element on one surface side of a base substrate; and
forming a sealing film covering the light-emitting element,
wherein the step of forming the sealing film includes the steps of: forming a first inorganic film covering the light-emitting element; inspecting a substrate surface on which the first inorganic film is formed to detect positions of foreign matters on the substrate surface; storing the positions of the foreign matters detected; forming a resin layer in an island shape by an ink-jet method at the positions of the foreign matters stored on the first inorganic film; and forming a second inorganic film on the first inorganic film via the resin layer to form the sealing film.

9. The method of manufacturing the display device according to claim 8,
wherein a refractive index difference between the resin layer and the first inorganic film and the second inorganic film is less than 0.1.

10. The method of manufacturing the display device according to claim 8, the display device comprising:
a display region provided with the light-emitting element;
a frame region provided around the display region; and
a TFT layer provided between the base substrate and the light-emitting element,
wherein the light-emitting element includes a common electrode,
the TFT layer includes a wiring line layer and a flattening film provided on the wiring line layer,
a slit is provided in the flattening film, the slit surrounding the display region in the frame region,
the common electrode is electrically connected to the wiring line layer via the slit, and
in the step of forming the resin layer, a second resin layer formed by a same material as the resin layer is formed by an ink-jet method via the first inorganic film into the slit.

11. The method of manufacturing the display device according to claim 8,
wherein the light-emitting element is an organic EL element.

12. A display device comprising:
a base substrate;
a light-emitting element provided on one surface side of the base substrate; and
a sealing film provided covering the light-emitting element,
wherein the sealing film includes a first inorganic film and a second inorganic film sequentially provided covering the light-emitting element, and a resin layer provided in an island shape between the first inorganic film and the second inorganic film,
wherein the display device, further comprising:
a display region provided with the light-emitting element;
a frame region provided around the display region; and
a TFT layer provided between the base substrate and the light-emitting element,
wherein the light-emitting element includes a common electrode,
the TFT layer includes a wiring line layer and a flattening film provided on the wiring line layer,
a slit is provided in the flattening film, the slit surrounding the display region in the frame region,
the common electrode is electrically connected to the wiring line layer via the slit,
a second resin layer formed by a same material to a same layer as the resin layer is filled into the slit via the first inorganic film, and
the second inorganic film is provided covering the second resin layer.

13. The display device according to claim 12,
wherein the resin layer includes a polypropylene resin.

14. The display device according to claim 12,
wherein the first inorganic film and the second inorganic film are formed by a silicon nitride film.

15. The display device according to claim 12,
wherein the light-emitting element is an organic EL element.

* * * * *